United States Patent
Freling et al.

(10) Patent No.: US 7,455,913 B2
(45) Date of Patent: Nov. 25, 2008

(54) THERMAL BARRIER COATING COMPOSITIONS, PROCESSES FOR APPLYING SAME AND ARTICLES COATED WITH SAME

(75) Inventors: Melvin Freling, West Hartford, CT (US); Michael J. Maloney, Marlborough, CT (US); David A. Litton, Rocky Hill, CT (US); Kevin W. Schlichting, Storrs, CT (US); John G. Smeggil, Simsbury, CT (US); David B. Snow, Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 281 days.

(21) Appl. No.: 11/328,896

(22) Filed: Jan. 10, 2006

(65) Prior Publication Data

US 2007/0160873 A1    Jul. 12, 2007

(51) Int. Cl.
*B32B 9/00* (2006.01)
(52) U.S. Cl. ............... 428/469; 428/472; 428/701; 428/702; 416/241 B
(58) Field of Classification Search ............... None
See application file for complete search history.

(56) References Cited

U.S. PATENT DOCUMENTS

| | | | |
|---|---|---|---|
| 3,528,861 A | 9/1970 | Elam et al. | |
| 3,542,530 A | 11/1970 | Talboom, Jr. et al. | |
| 3,649,225 A | 3/1972 | Simmons, Jr. | |
| 3,676,085 A | 7/1972 | Evans et al. | |
| 3,754,903 A | 8/1973 | Goward et al. | |
| 4,078,922 A | 3/1978 | Magyar et al. | |
| 4,248,940 A * | 2/1981 | Goward et al. | 428/633 |
| 4,585,481 A | 4/1986 | Gupta et al. | |
| 5,667,641 A * | 9/1997 | Poirier et al. | 162/207 |
| 2007/0160859 A1 | 7/2007 | Darolia et al. | |

OTHER PUBLICATIONS

European Search Report, May 3, 2007.

* cited by examiner

*Primary Examiner*—Timothy M Speer
(74) *Attorney, Agent, or Firm*—Bachman & LaPointe, P.C.

(57) ABSTRACT

A process of coating an article includes the steps of (1) applying upon at least one surface of an article at least one graded layer of at least one ceramic based compound comprising at least one metal selected from the group consisting of lanthanum, cerium, praseodymium, neodymium, promethium, samarium, europium, gadolinium, terbium, dysprosium, holmium, erbium, thulium, ytterbium, lutetium, indium, scandium, yttrium, zirconium, hafnium, titanium, and mixtures thereof; (2) optionally drying the coated article; and (3) optionally repeating steps (1) and (2).

16 Claims, 2 Drawing Sheets

THERMAL BARRIER COATING COMPOSITIONS, PROCESSES FOR APPLYING SAME AND ARTICLES COATED WITH SAME

BACKGROUND OF THE INVENTION

The invention relates to thermal barrier coating compositions, processes for applying same and articles coated with same. More particularly, the invention relates to thermal barrier coating compositions designed to withstand sand infiltration, processes for applying same and articles coated with same.

The degradation of turbomachinery parts due to sand related distress of thermal barrier coatings ("TBCs") is a concern with respect to all turbomachinery in use in the Middle East. Sand related distress is responsible for the premature spallation of TBCs and oxidation of turbomachinery and their parts. The mechanism of such sand related distress is the penetration of the TBCs by molten sand. During its useful life, sand may enter the turbomachinery, agglomerate and become molten upon the TBC surface. Typically the surface temperature of the turbomachinery is higher than the melting point temperature of the sand. As a result, the agglomerated sand particles become somewhat molten, penetrate the TBC and reach the ceramic/metallic interface. The failure of the TBC occurs by a combination of molten sand attacking the thermally grown oxide at the ceramic/metallic interface as well as the reduction in strain tolerance, of the fully infiltrated TBC, to thermal cycling. Failure of the TBC occurs by spallation which exposes the part's surface to the elements, thus causing the accelerated oxidation of the turbomachinery part in conjunction with molten sand attack.

Consequently, there exists a need for a thermal barrier coating designed to resist sand related distress.

SUMMARY OF THE INVENTION

In accordance with the present invention, a process of coating an article broadly comprises applying upon at least one surface of an article at least one graded layer of at least one ceramic based compound broadly comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

In accordance with the present invention, a thermal barrier coating broadly comprises a graded coating broadly comprising at least one ceramic based compound broadly comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof; wherein the thermal barrier coating broadly comprises a porosity of no more than about 30 percent by volume of the thermal barrier coating.

In accordance with the present invention, a coated article broadly comprises an article broadly comprising at least one surface broadly comprising a thermal barrier coating disposed thereupon, wherein the thermal barrier coating broadly comprises a graded coating broadly comprising at least one ceramic based compound broadly comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof; wherein the thermal barrier coating broadly comprises a porosity of no more than about 30 percent by volume of the thermal barrier coating.

In accordance with the present invention, a coating broadly comprises a reaction product of at least one silicate and a thermal barrier coating composition, wherein said thermal barrier coating composition broadly comprises at least one ceramic based compound broadly comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof; wherein the reaction product broadly comprises a porosity of no more than about 30 percent by volume of the coating.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

As used herein, the term "thermal barrier composition" means a composition comprising at least one ceramic based compound and at least one metal capable of reacting with silicates, and exhibits a coefficient of thermal expansion value sufficient for use in any turbomachinery application.

As used herein, the term "at least one metal" means at least one metal originally present in the form of a metal, metal oxide, metal salt, and the like, that is capable of reacting with at least one silicate to form a reaction product exhibits thermodynamic and chemical equilibrium when combined with or makes contact with a ceramic based compound, any silicate based material, and the like.

The thermal barrier coating (hereinafter referred to as "TBC") of the present invention is designed to prevent at least one silicate, such as a component of sand including, but not limited to, calcium magnesia alumina silicate (hereinafter referred to as "CMAS"), from penetrating the ceramic based compound of the TBC, thus causing premature oxidation of the article and preventing spallation of the TBC. Sand generally comprises at least CMAS as well as other components such as, but not limited to, sodium, iron, potassium and the like, depending upon the geographical and geological conditions of the sand. Sands containing iron and CMAS (e.g., Fe-CMAS), also considered a silicate, pose similar problems as described above due to iron-CMAS interaction and their penetration of the metallic/ceramic interface of the coated article.

Figure 1:
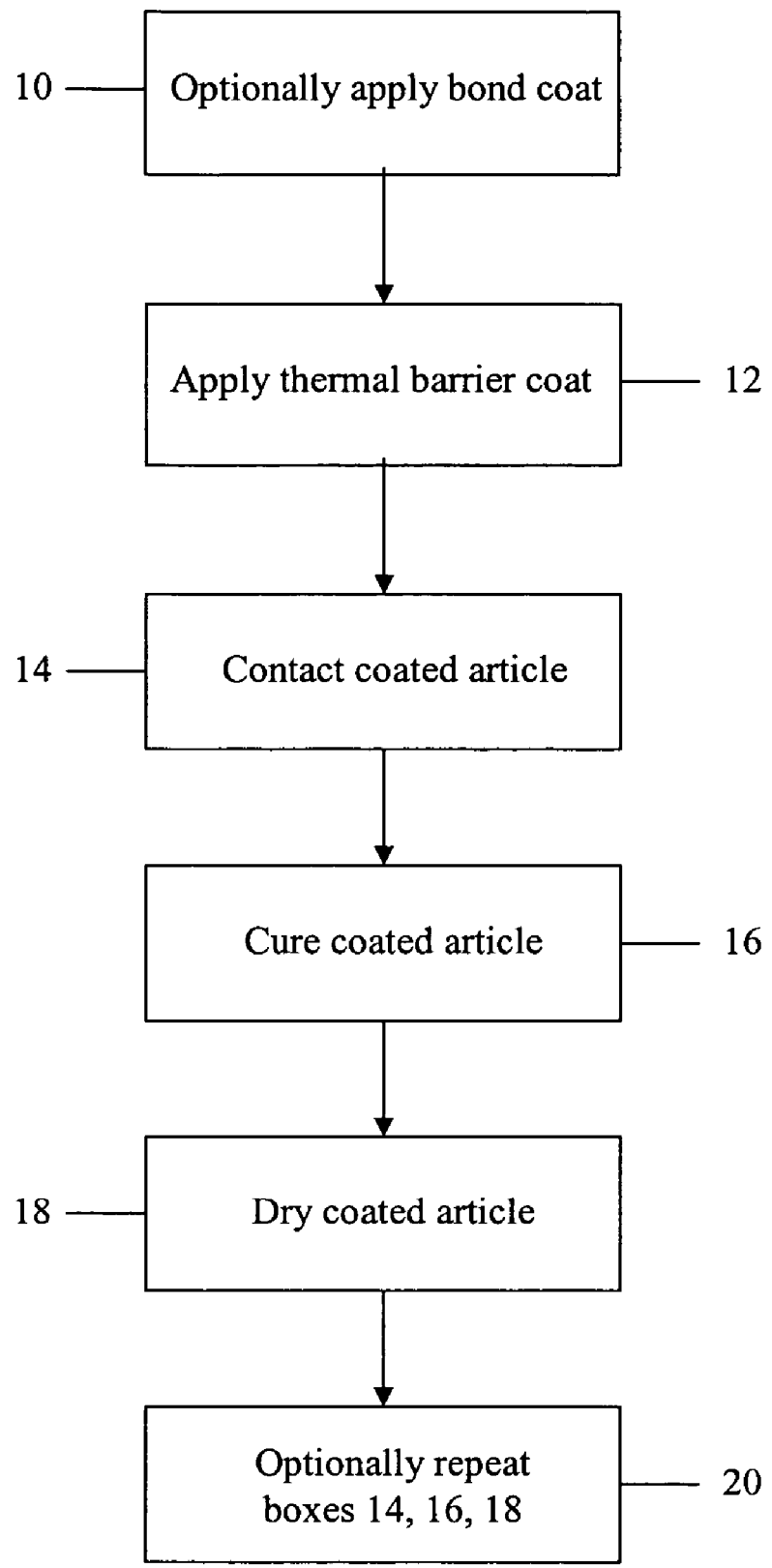
FIG. 1 is a flowchart representing a process of the present invention.

Referring now to FIG. 1, a flowchart representing a process of the present invention is shown. An article may be provided and may be coated with an optional bond coat material at a box 10 of both FIG. 1. The bond coat material may comprise a formula MCrAlY. MCrAlY refers to known metal coating systems in which M denotes nickel, cobalt, iron, their alloys, and mixtures thereof; Cr denotes chromium; Al denotes aluminum; and Y denotes yttrium. MCrAlY materials are often known as overlay coatings because they are applied in a predetermined composition and do not interact significantly with the substrate during the deposition process. For some non-limiting examples of MCrAlY materials see U.S. Pat. No. 3,528,861 which describes a FeCrAlY coating as does U.S. Pat. No. 3,542,530. In addition, U.S. Pat. No. 3,649,225 describes a composite coating in which a layer of chromium is applied to a substrate prior to the deposition of a MCrAlY coating. U.S. Pat. No. 3,676,085 describes a CoCrAlY overlay coating while U.S. Pat. No. 3,754,903 describes a NiCoCrAlY overlay coating having particularly high ductility. U.S. Pat. No. 4,078,922 describes a cobalt base structural alloy which derives improved oxidation resistance by virtue of the presence of a combination of hafnium and yttrium. A preferred MCrAlY bond coat composition is described in U.S. Pat. No. Re. 32,121, which is assigned to the present Assignee and incorporated herein by reference, as having a weight percent compositional range of 5-40 Cr, 8-35 A, 0.1-2.0 Y, 0.1-7 Si, 0.1-2.0 Hf, balance selected from the group consisting of Ni, Co and mixtures thereof. See also U.S. Pat. No. 4,585,481, which is also assigned to the present Assignee and incorporated herein by reference.

The bond coat material may also comprise Al, PtAl and the like, that are often known in the art as diffusion coatings. In addition, the bond coat material may also comprise Al, PtAl, MCrAlY as described above, and the like, that are often known in the art as cathodic arc coatings.

The MCrAlY bond coat may be applied by any method capable of producing a dense, uniform, adherent coating of the desired composition, such as, but not limited to, an overlay bond coat, diffusion bond coat, cathodic arc bond coat, etc. Such techniques may include, but are not limited to, diffusion processes (e.g., inward, outward, etc.), low pressure plasma-spray, air plasma-spray, sputtering, cathodic arc, electron beam physical vapor deposition, high velocity plasma spray techniques (e.g., HVOF, HVAF), combustion processes, wire spray techniques, laser beam cladding, electron beam cladding, etc.

The particle size for the bond coat may be of any suitable size, and in embodiments may be between about 15 microns (0.015 mm) and about 60 microns (0.060 mm) with a mean particle size of about 25 microns (0.025 mm). The bond coat 30 may be applied to any suitable thickness, and in embodiments may be about 5 mils (0.127 mm) to about 10 mils (0.254 mm) thick. In some embodiments, the thickness may be about 6 mils (0.152 mm) to about 7 mils (0.178 mm) thick.

After applying an optional bond coat layer to the article, the article may be coated with a thermal barrier composition to form a thermal barrier coating at box 12 of FIG. 1. The article may comprise any part that is typically coated with a thermal barrier composition and, in particular, may comprise a part used in turbomachinery applications such as, but not limited to, any part having an airfoil, any part having a seal, airfoils, seals, and the like.

The thermal barrier composition may be applied to the article using any number of processes known to one of ordinary skill in the art. Suitable application processes include, but are not limited to, physical vapor deposition (e.g., electron beam), thermal spray (e.g., air plasma, high velocity oxygen fuel), sputtering, combinations comprising at least one of the foregoing processes, and the like. The thermal barrier composition may comprise at least one ceramic based compound, at least one metal, including metal oxides, ultra-violet and/or heat cured resins, and the like. As recognized by one of ordinary skill in the art, a thermal barrier coating applied via an electron beam physical vapor deposition process forms an intercolumnar microstructure exhibiting free standing columns with interstices, that is, pores, voids, and the like, formed between the columns. Also as recognized by one of ordinary skill in the art, a thermal barrier coating applied via a thermal spray process exhibits a tortuous, interconnected porosity due to the splats and microcracks formed via the thermal spray process.

The at least one metal may be co-deposited with the ceramic based compound to form at least one graded layer as known to one of ordinary skill in the art using such suitable application processes such as, but not limited to, physical vapor deposition (e.g., electron beam), thermal spray (e.g., air plasma, high velocity oxygen fuel), sputtering, combinations comprising at least one of the foregoing processes, and the like. The at least one ceramic based compound and at least one metal of the TBC may be applied using the same processes, for example, applying both the ceramic based compound and the at least one metal using a physical vapor deposition process. Grading the ceramic based compound and the at least one metal may form a coating where the at least one metal may be present in an amount of about 100% at least at the surface of the graded TBC.

The thermal barrier composition may comprise at least one ceramic based compound for use with turbomachinery applications as known to one of ordinary skill in the art. Representative ceramic based compounds include, but are not limited to, any stabilized zirconate, any stabilized hafnate, combinations comprising at least one of the foregoing compounds, and the like, for example, yttria stabilized zirconia, calcia stabilized zirconia, magnesia stabilized zirconia, yttria stabilized hafnia, calcia stabilized hafnia and magnesia stabilized hafnia. Yttria stabilized zirconia is commercially available as 7YSZ®.

The thermal barrier compound may also comprise at least one metal. The metal may be selected based upon the ability to react with at least one silicate and form a reaction product. The reaction product exhibits both thermodynamic and chemical equilibrium when combined with or makes contact with a ceramic based compound, any silicate based material, and the like. Suitable metals for use herein may include, but are not limited to, lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, mixtures thereof, and the like. The at least one metal may be deposited, e.g., co-deposited, in any form as required by the process operating conditions. The at least one metal may be present as the metal (e.g., fine particulate, solid target, powder, etc.), metal oxide (e.g., single, binary, polymetal), metal salt (e.g., single, binary, polymetal), and the like. During the co-deposition process, the at least one metal may react with the ceramic based compound to form stabilized ceramic based compound as known to one of ordinary skill in the art. For example, gadolinium may be co-deposited with 7YSZ® to form a gadolinia stabilized zirconia thermal barrier coating.

Once the TBC is applied, the article may be contacted with a solution comprising at least one ultra-violet or heat curable resin at a box 14 of FIG. 1. When the TBC comprises columnar structures with interstices, the article may be dipped or immersed within the solution at about 68° F. (20° C.) to about 150° F. (66° C.) and initially under a vacuum of about 10 torr (0.19 psi) to about 100 torr (1.9 psi) for about 2 minutes to about 5 minutes at which point the pressure may then be adjusted to atmospheric pressure, that is, about 760 torr (14.7 psi). When the TBC comprises a tortuous, interconnected porosity, the article may be dipped or immersed within the solution at about 68° F. (20° C.) to about 150° F. (66° C.) and initially under a vacuum of about 10 torr (0.19 psi) to about 100 torr (1.9 psi) for about 2 to about 10 minutes at which point the pressure may then be adjusted to atmospheric pressure. Suitable solvents for use in the solution include, but are not limited to, water, alcohols, combinations comprising at least one of the foregoing solvents, and the like.

The ultra-violet curable resin may comprise a resin, at least one of each of the following: initiator, additive, modifier, monomer, and oligomer. The resin may comprise a urethane based resin that may require one or more curing steps, for example, a dual curing resin. The at least one initiator may comprise a substance that initiates polymerization of the resin when exposed to ultra-violet light energy of a compatible wavelength. For a dual curing resin, two initiators may be required such that the second initiator may require heat in order to facilitate polymerization of the resin. Dual cure resins are effective when curing coatings where the ultra-violet light energy may not reach the resin material, such as in between the columnar or microcolumnar structures of the coating or at a certain depth in the coating as known to one of ordinary skill in the art. The at least one additive may comprise a filler chemical capable of enhancing one or more resin properties such as, but not limited to, flow rate, wetting, color, fluorescence and achieving tack-free surfaces. The at least one modifier may comprise a substance capable of increasing the durability, for example, impact resistance, crack resistance and the like, of the resin. The at least one monomer may comprise at least one single unit of a polymer capable of providing and/or enhancing adhesion to surface materials, for example, the adhesion of the resin to the surface of the article being coated. The at least one oligomer is recognized as the backbone of the resin and may comprise a polymer unit of about 6 to about 40 monomer units that imparts the basic properties of the ultra-violet curable resin such as, but not limited to, hardness, elongation, chemical resistance, and the like. In the alternative, the ultra-violet curable resin may be substituted with at least one heat curable resin as known to one of ordinary skill in the art.

After contacting the TBC coated article, the coated article may be treated with ultra-violet light energy at a box 16 of FIG. 1 to cure the ultra-violet curable resin present in the TBC. The coated article may be treated with ultra-violet light energy for about 10 second to about 60 seconds using processes known to one of ordinary skill in the art. In the alternative, when utilizing a heat curable resin, the coated article may be treated at a temperature of about 300° F. for about 20 minutes to about 60 minutes in an oven, or similar suitable apparatus, as known to one of ordinary skill in the art.

After curing the TBC coated article, the article may be dried to remove, that is, evaporate or burn off, the excess solvent, dispersant and/or resin materials at a box 18 of FIG. 1. The article may be dried using any processes known to one of ordinary skill in the art suitable for use herein. Suitable drying processes include, but are not limited to, air drying, drying under pressure, drying under a heating element, combinations comprising at least one of the foregoing processes, and the like. The amount of time necessary to dry the article depends upon several factors and, in particular, the solvent of the suspension. For example, the TBC coated article may be dried at a temperature of about 750° F. to about 1600° F. for about 10 minutes to about 90 minutes in order to burn off the resin materials. However, when applying the TBC using any thermal spray process, the drying step may become optional and/or omitted from the process.

Referring again to FIG. 1, after optionally drying the article, the steps of boxes 14, 16, and 18 may be repeated as often as necessary at a box 20 in FIG. 1 in order to achieve the desired TBC properties. The desired TBC properties of the coated article may be characterized as at least a desired porosity of no more than about 30% by volume of the TBC, and preferably no more than about 20% by volume of the TBC.

The thermal barrier coating of the present invention is designed to react with at least one silicate and form a reaction product, e.g., a layer, on or within the TBC. As a result, a thermal barrier coating of the present invention during its use may comprise at least a reaction product of at least one silicate and the components of the TBC composition of the present invention.

The components of the TBC composition may be the aforementioned at least one ceramic based compound and at least one metal described herein including the amounts disclosed. The reaction product of the at least one silicate and at least one metal of the TBC of the present invention may comprise further at least one reaction product as more than one reaction product may form during the useful life of the coated article of the present invention. For example, a TBC comprising gadolinium stabilized zirconate and 7YSZ® may react with CMAS to form a reaction product may comprise, for example, silicate oxyapatite, silicate, garnet, gadolinia, calcia, zirconia, silica, mixtures thereof and the like.

The reaction product or products form throughout the entirety of the TBC of the present invention as the at least one metal is dispersed throughout the entirety of the TBC and the at least one silicate, e.g., molten sand, penetrates through to the coated article's metallic/ceramic interface. The at least one reaction product forms a sealant composition or layer throughout the TBC. The resultant sealant composition remains present as the TBC experiences typical wear and tear, for example, abrasion, erosion, spallation, etc., consistent with general use. Thus, as the TBC wears during its useful life, the sealant layer reforms, remains intact and effectively takes the place of the TBC. The resultant sealant layer may also exhibit the desired porosity of no more than about 30% by volume of the coating, and preferably no more than about 20% by volume of the coating.

Figure 2:
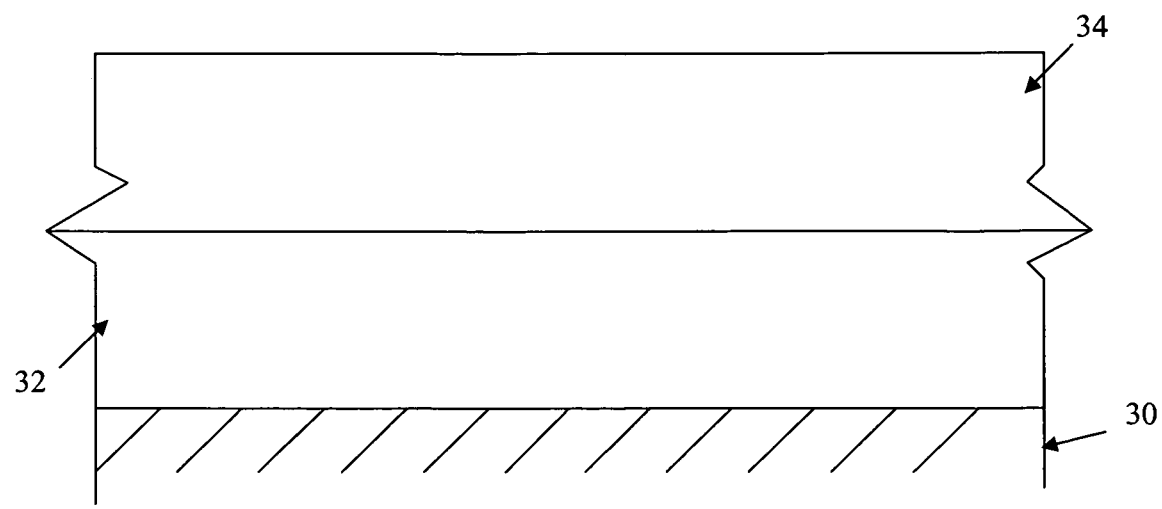
FIG. 2 is a representation of an article coated with a bond coat and at least one graded layer of a thermal barrier coating of the present invention.
Figure 3:
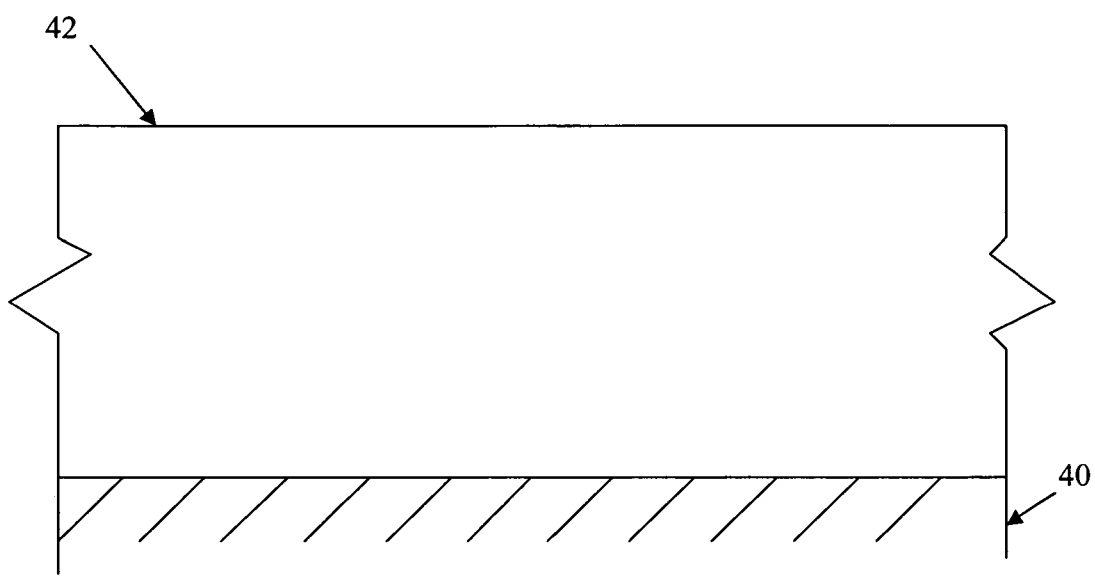
FIG. 3 is a representation of an article coated with at least one graded layer of a thermal barrier coating of the present invention.

Referring now to FIGS. 2 and 3, the resultant product in all of the processes of the present invention may be an article 30 coated with an optional bond coat layer 32 and at least one graded layer of a thermal barrier coating 34 (See FIG. 2), or an article 40 coated with at least one graded layer of the thermal barrier coating (See FIG. 3). As described earlier, the article may comprise a part used in turbomachinery applications such as, but not limited to, any part having an airfoil, any part having a seal, airfoils, seals, and the like. As known to one of ordinary skill in the art, TBC coatings for turbomachinery parts having seals, or seals in general, are typically thicker than TBC coatings for turbomachinery parts having an airfoil, or airfoils in general. Likewise, the coated articles of the present invention adhere to these industry standards known to one of ordinary skill in the art.

For example, the article may include, but is not limited to blades, vanes, stators, and mid-turbine frames. And, in yet another example, the article may include, but is not limited to, seals, combustor panels, combustor chambers, combustor bulkhead shields, disk side plates and fuel nozzle guides.

Generally, coated articles having an airfoil, or a coated airfoil in general, of the present invention generally comprise a graded coating of the present invention of about 0.25 mils to about 15 mils in thickness. And, generally, coated articles having a seal, or a coated seal in general, of the present invention comprise a graded coating of the present invention of about 0.25 mils to about 50 mils in thickness. These ranges of coating thicknesses for such coated articles of the present invention may be broadened or narrowed depending upon the particular application of the article as will be recognized and understood by one of ordinary skill in the art.

One or more embodiments of the present invention have been described. Nevertheless, it will be understood that various modifications may be made without departing from the spirit and scope of the invention. Accordingly, other embodiments are within the scope of the following claims.

What is claimed is:

1. A thermal barrier coating, comprising:
    a graded coating comprising at least one ceramic based compound comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof;
    wherein the thermal barrier coating comprises a porosity of no more than about 30 percent by volume of the thermal barrier coating,
    wherein said graded coating comprises said at least one metal present in an amount of about 100% at least at a surface of the thermal barrier coating;
    wherein said at least one metal reacts with at least one silicate to form a reaction product.

2. The thermal barrier coating of claim 1, wherein at least one of said at least one ceramic based compound is selected from the group consisting of yttria stabilized zirconia, calcia stabilized zirconia, magnesia stabilized zirconia, yttria stabilized hafnia, calcia stabilized hafnia, and magnesia stabilized hafnia.

3. The thermal barrier coating of claim 1, wherein said at least one ceramic based compound comprises gadolinia stabilized zirconate and yttria stabilized zirconate.

4. The thermal barrier coating of claim 1, wherein the thermal barrier coating comprises a porosity of no more than 20 percent by volume of the thermal barrier coating.

5. A coated article, comprising:
    an article comprising at least one surface having a thermal barrier coating disposed thereupon,
    wherein said thermal barrier coating includes a graded coating comprising at least one ceramic based compound comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof;
    wherein the thermal barrier coating comprises a porosity of no more than about 30 percent by volume of said thermal barrier coating,
    wherein said graded coating comprises said at least one metal present in an amount of about 100% at least at a surface of said thermal barrier coating;
    wherein said at least one metal reacts with at least one silicate to form a reaction product.

6. The coated article of claim 5, wherein at least one of said at least one ceramic based compound is selected from the group consisting of yttria stabilized zirconia, calcia stabilized zirconia, magnesia stabilized zirconia, yttria stabilized hafnia, calcia stabilized hafnia, and magnesia stabilized hafnia.

7. The coated article of claim 5, wherein said at least one ceramic based compound comprises gadolinia stabilized zirconate and yttria stabilized zirconate.

8. The coated article of claim 5, wherein the thermal barrier coating comprises a porosity of no more than 20 percent by volume of said thermal barrier coating.

9. The coated article of claim 5, wherein said article is selected from the group consisting of blades, vanes, stators and mid-turbine frame.

10. The coated article of claim 9, wherein said thermal barrier coating comprises a thickness of about 5 mils to about 15 mils.

11. The coated article of claim 5, wherein said article is selected from the group consisting of seals, combustor panels, combustor chambers, combustor bulkhead shields, disk side plates and fuel nozzle guides.

12. The coated article of claim 11, wherein said thermal barrier coating comprises a thickness of about 0.5 mils to about 50 mils.

13. A coating, comprising:
    a reaction product of at least one silicate and a thermal barrier coating composition,
    wherein said thermal barrier coating composition comprises:
    at least one ceramic based compound comprising at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof;
    wherein said reaction product comprises a porosity of no more than about 30 percent by volume of the coating.

14. The coating of claim 13, wherein at least one of said at least one ceramic based compound is selected from the group consisting of yttria stabilized zirconia, calcia stabilized zirconia, magnesia stabilized zirconia, yttria stabilized hafnia, calcia stabilized hafnia, and magnesia stabilized hafnia.

15. The coating of claim 13, wherein said at least one ceramic based compound comprises gadolinia stabilized zirconate and yttria stabilized zirconate.

16. The coating of claim 13, wherein said reaction product comprises a porosity of no more than 20 percent by volume of the coating.

* * * * *

UNITED STATES PATENT AND TRADEMARK OFFICE
CERTIFICATE OF CORRECTION

PATENT NO.         : 7,455,913 B2
APPLICATION NO. : 11/328896
DATED              : November 25, 2008
INVENTOR(S)       : Melvin Freling et al.

It is certified that error appears in the above-identified patent and that said Letters Patent is hereby corrected as shown below:

In column 3, line 26, "A,", should read --Al,--.

In column 7, line 41, "hafhia", should read --hafnia-- (both occurrences).

In column 7, line 59, "hafhium", should read --hafnium--.

In column 8, line 13, "hafhia", should read --hafnia--.

In column 8, line 52, "hafhia", should read --hafnia--.

Signed and Sealed this

Third Day of March, 2009

JOHN DOLL
*Acting Director of the United States Patent and Trademark Office*